US 8,227,873 B2

(12) United States Patent
Smith

(10) Patent No.: US 8,227,873 B2
(45) Date of Patent: Jul. 24, 2012

(54) INTEGRATED ONE-TIME PROGRAMMABLE SEMICONDUCTOR DEVICE PAIR

(75) Inventor: Douglas Smith, Mesa, AZ (US)

(73) Assignee: Broadcom Corporation, Irvine, CA (US)

(*) Notice: Subject to any disclaimer, the term of this patent is extended or adjusted under 35 U.S.C. 154(b) by 281 days.

(21) Appl. No.: 12/798,766

(22) Filed: Apr. 9, 2010

(65) Prior Publication Data

US 2011/0248356 A1 Oct. 13, 2011

(51) Int. Cl.
*H01L 27/112* (2006.01)
*H01L 21/8246* (2006.01)

(52) U.S. Cl. ......... 257/390; 257/E27.102; 257/E21.662; 438/294

(58) Field of Classification Search .................. 257/390, 257/E27.102, E21.662; 438/294
See application file for complete search history.

(56) References Cited

U.S. PATENT DOCUMENTS

| | | | | |
|---|---|---|---|---|
| 7,402,855 | B2 * | 7/2008 | Kurjanowicz | 257/288 |
| 2006/0244099 | A1 * | 11/2006 | Kurjanowicz | 257/530 |
| 2006/0292754 | A1 * | 12/2006 | Min et al. | 438/131 |
| 2009/0283814 | A1 * | 11/2009 | Chen et al. | 257/318 |
| 2010/0032732 | A1 * | 2/2010 | Booth et al. | 257/288 |
| 2011/0210397 | A1 * | 9/2011 | Hui et al. | 257/368 |

* cited by examiner

*Primary Examiner* — Victor A Mandala
(74) *Attorney, Agent, or Firm* — Farjami & Farjami LLP

(57) ABSTRACT

According to one disclosed embodiment, an integrated one-time programmable (OTP) semiconductor device pair includes a split-thickness dielectric under an electrode and over an isolation region formed in a doped semiconductor substrate, where a reduced-thickness center portion of the dielectric forms, in conjunction with the isolation region, programming regions of the OTP semiconductor device pair, and where the thicker, outer portions of the dielectric form dielectrics for transistor structures. In one embodiment, the split-thickness dielectric comprises a gate dielectric. In one embodiment, multiple OTP semiconductor device pairs are formed in an array that minimizes the number of connections required to program and sense states of specific OTP cells.

20 Claims, 4 Drawing Sheets

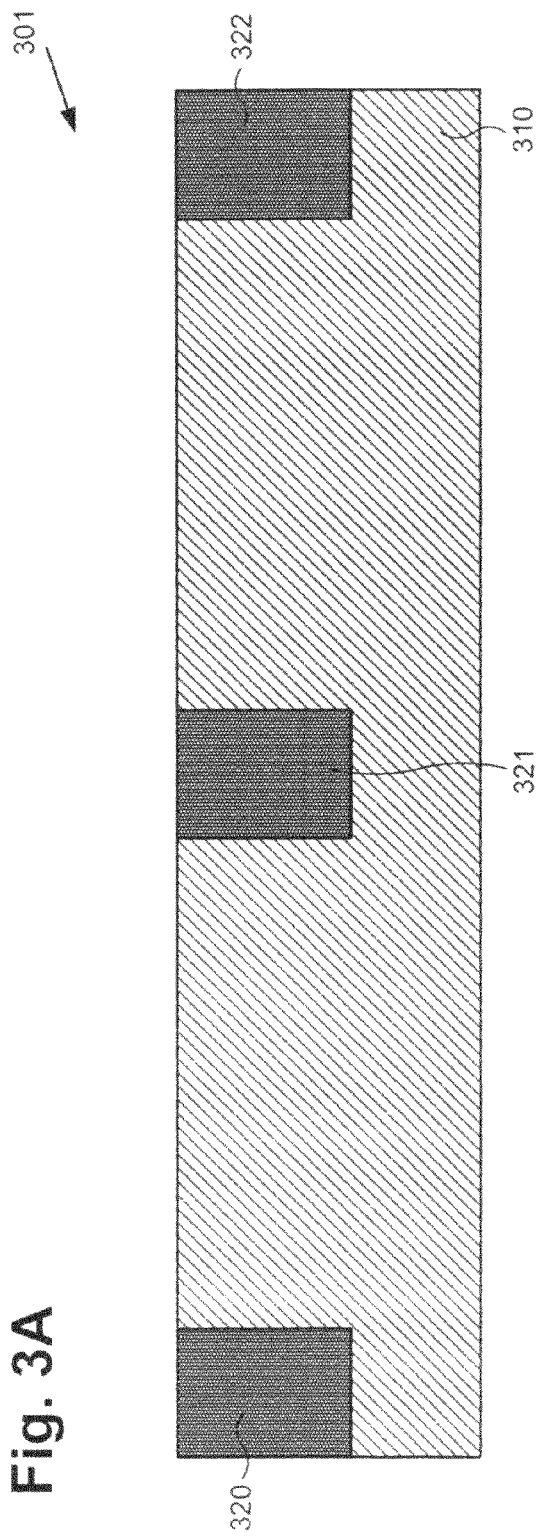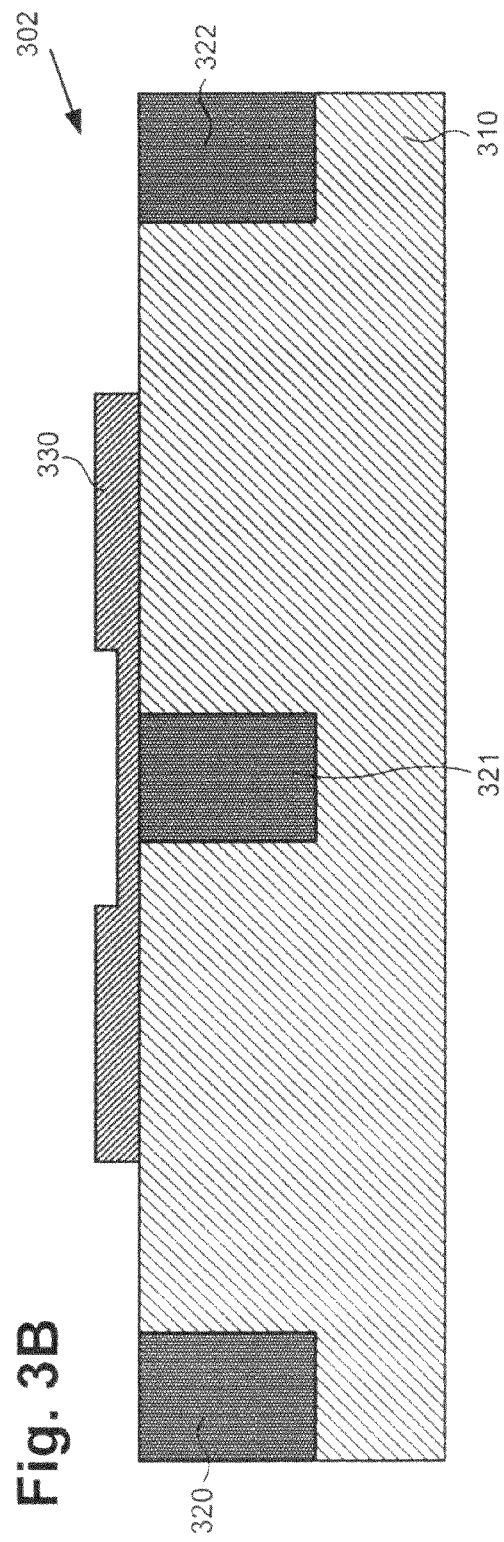
Fig. 3A
Fig. 3B

INTEGRATED ONE-TIME PROGRAMMABLE SEMICONDUCTOR DEVICE PAIR

BACKGROUND OF THE INVENTION

1. Field of the Invention

The present invention is generally in the field of semiconductors. More particularly, the present invention is in the field of one-time programmable semiconductor device fabrication.

2. Background Art

One-time programmable (OTP) devices are used throughout the semiconductor industry to allow for post-fabrication design changes in integrated circuits (ICs). For example, after post-fabrication functionality testing yet before sale to a customer, a semiconductor device manufacturer can program a network of OTP devices embedded in a particular semiconductor die to provide a permanent serial number encoding for that particular die. Under other circumstances, a single OTP device can be programmed to permanently enable or disable a portion of an IC at any time after fabrication, including after sale to a customer. While this functionality is in great demand, conventional OTP devices can be larger than desired, for example, making conventional OTP devices less reliable and more expensive to manufacture and integrate into semiconductor devices.

Conventional OTP devices can be fabricated using a gate structure comprising a relatively wide single channel interface with two different gate dielectric thicknesses. The thin portion of gate dielectric can be made to destructively break down and form a conductive path from gate to channel, thereby switching the conventional OTP device into a "programmed" state. This approach, however, can suffer from relatively little control over where the conductive path is formed within the thin gate dielectric, and this lack of control can result in a relatively wide distribution of impedances for programmed states. Such conventional OTP devices can, as a result, exhibit relatively poorly differentiated programmed and un-programmed states as seen by a sensing circuit, as well as programmed states having impedances that can change over the lifetime of the device. Mitigation of these issues can require additional die space for high voltage sensing circuitry and/or for redundancy techniques, for example, which can involve undesirable increases in manufacturing cost.

Thus, there is a need to overcome the drawbacks and deficiencies in the art by providing a highly reliable OTP device that can be fabricated within a smaller area than can existing conventional OTP devices.

SUMMARY OF THE INVENTION

An integrated one-time programmable (OTP) semiconductor device pair, substantially as shown in and/or described in connection with at least one of the figures, as set forth more completely in the claims.

BRIEF DESCRIPTION OF THE DRAWINGS

FIG. 3A illustrates a cross-sectional view, which includes a portion of a wafer processed according to an embodiment of the invention, corresponding to an initial step in the flowchart in FIG. 2.

FIG. 3B illustrates a cross-sectional view, which includes a portion of a wafer processed according to an embodiment of the invention, corresponding to an intermediate step in the flowchart in FIG. 2.

DETAILED DESCRIPTION OF THE INVENTION

Figure 1:
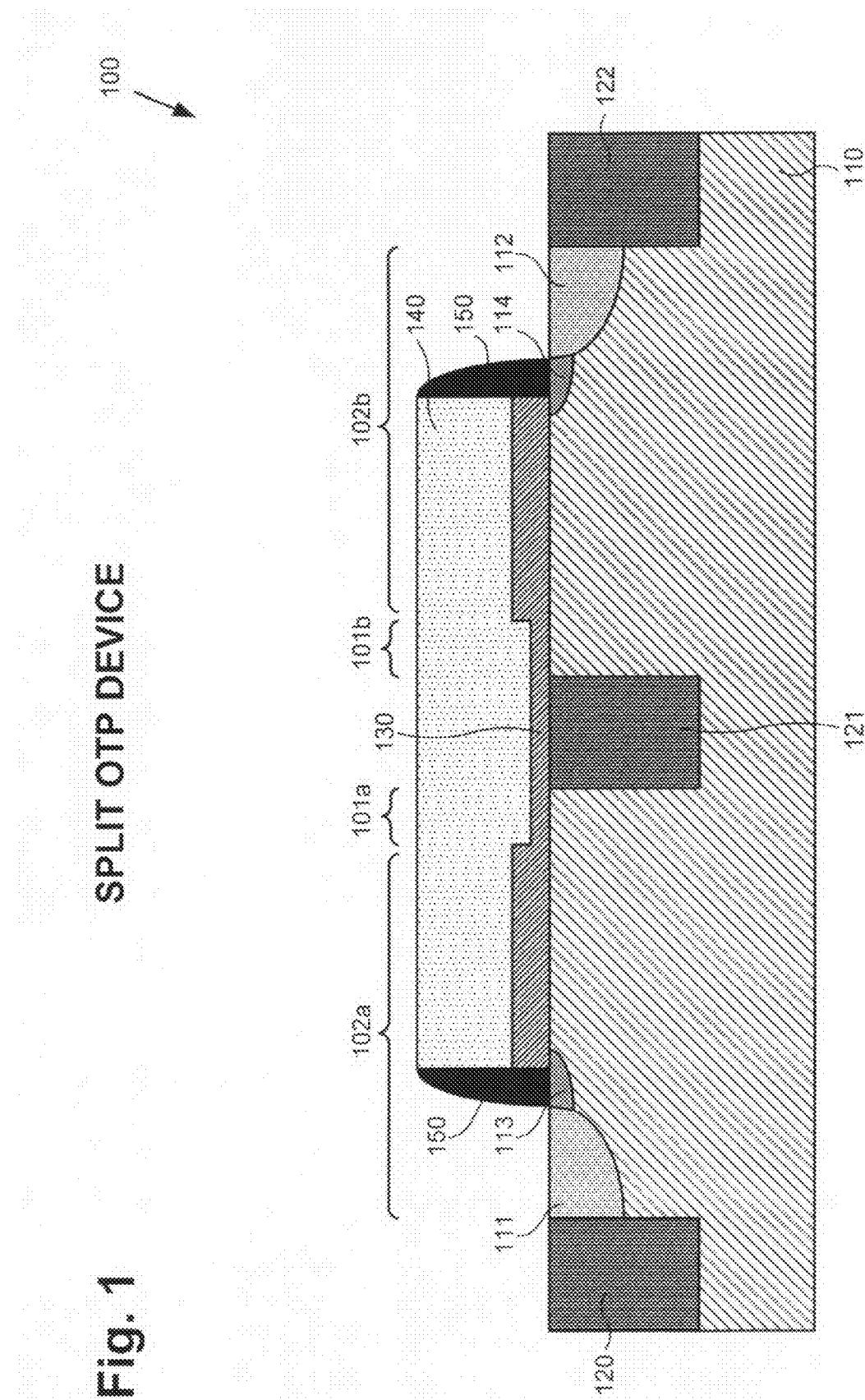
FIG. 1 illustrates a cross-sectional view of a portion of a wafer processed to form an integrated one-time programmable (OTP) semiconductor device pair, according to one embodiment of the present invention.

The present invention is directed to an integrated one-time programmable (OTP) semiconductor device pair. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be understood that unless noted otherwise, like or corresponding elements among the figures may be indicated by like or corresponding reference numerals. Moreover, the drawings and illustrations in the present application are generally not to scale, and are not intended to correspond to actual relative dimensions.

Conventional OTP devices can be configured to function as, for example, fuses, anti-fuses, ROM structures, redundancy structures, OTP resistor networks, high-security encoding structures, and the like. While each function is highly desirable across the semiconductor manufacturing market, conventional OTP devices can require a relatively large portion of semiconductor wafer area to implement, which can in turn lead to undesirable operating characteristics.

For example, conventional OTP devices can exhibit a relatively large programming region, which, by itself, has two main drawbacks. It can lead to an inefficient overall size for a conventional OTP device, and it can result in a relatively uncontrolled breakdown process where programming conditions (usually a high voltage pulse across a programming region) can form a conductive path at any point across the entire programming region. A wide distribution of possible locations for formation of the conductive path can result in a wide distribution of impedances for programmed states, and can also result in impedances that change over the lifetime of the OTP device, both of which can equate to poorly differentiated programmed states that are difficult to reliably sense across a large array of OTP devices. This can be mitigated by, for example, increasing a sensing voltage or relying on redundant OTP device arrays, but each mitigation strategy can require additional die area and/or manufacturing cost.

FIG. 1 illustrates a cross-sectional view of an embodiment of the present invention that addresses the above problems. FIG. 1 shows OTP device 100 formed by leveraging processing techniques for fabricating polysilicon-gate (poly-gate) transistors (e.g., P channel or N channel field-effect transistors—PFETs or NFETs) and other conventional CMOS devices. OTP device 100 can comprise, for example, programming region 101a coupled with, for example, NFET structure 102a, and programming region 101b coupled with, for example, NFET structure 102b, where the entire OTP device 100 can be configured to function as two independently programmable OTP cells. Details of composition and formation of the above are more fully explained with respect to FIGS. 2, 3A and 3B below.

As shown in FIG. 1, programming regions 101a and 101b can comprise, for example, thin portions of split-thickness dielectric 130 (also referred to as "reduced-thickness portions" of the split-thickness dielectric in the present application), portions of electrode (or gate electrode) 140, and portions of doped substrate 110. The width of programming regions 101a and 101b can be set by the width and positioning of the thin portion (or the "reduced-thickness portion") of split-thickness dielectric 130 with respect to the width and positioning of isolation region 121, as shown in FIG. 1. By adjusting the width and positioning of both, programming regions 101a and 101b can be made smaller than conventional programming regions, which advantageously narrows the distribution of possible conductive path locations during programming, which in turn limits the distribution of impedances of a programmed state for programming regions 101a and 101b. In addition, the relatively controlled programming procedure can result in a lower tendency to produce programmed impedances that can change over time, which, in conjunction with the already relatively small distribution of programmed impedances, can reduce the need for high voltage sensing circuits or redundancy techniques, thereby reducing overall cost of manufacture.

Also shown in FIG. 1 are NFET structures 102a and 102b, which can comprise, for example, thick portions of split-thickness dielectric 130, portions of electrode 140, spacers 150, portions of doped substrate 110, implant regions 111 and 112 respectively, and lightly doped extension regions 113 and 114 respectively. In addition to isolation region 121, mentioned above, FIG. 1 includes isolation region 120 adjoining implant region 111, and isolation region 122 adjoining implant region 112.

Programming regions 101a and 101b and NFET structures 102a and 102b can make use of a common electrode, such as electrode 140, to minimize the number of connections required to operate OTP device 100, which can advantageously reduce an overall size for OTP device 100. For example, to program programming region 101a without changing the state of programming region 101b, a high voltage pulse can be applied to electrode 140 while implant region 111 is kept at a low voltage and implant region 112 is kept at a high voltage. A conductive path can form from electrode 140 through programming region 101a into doped substrate 110 and then to implant region 111 because NFET structure 102a can, by acting like a FET with a gate at a high voltage and a source at a low voltage, turn on and form a conduction path beneath its gate to its source (e.g., implant region 111). Once that conductive path begins to conduct current, programming region 101a can destructively break down and enter a programmed state.

Under these circumstances, NFET structure 102b should not similarly form a conductive path because a high voltage at its source (e.g., implant region 112) can keep NFET structure 102b from turning on and allowing conduction from programming region 101b to implant region 112. Cross-conduction from programming region 101b to implant region 111 is also unlikely because it is substantially blocked by isolation region 121. Thus, using the above technique and a single electrode, one programming region of OTP device 100 can be programmed without changing the state of the other programming region.

Similarly, programming states for either programming region 101a or 101b can be selectively sensed by, for example, applying a relatively low voltage at electrode 140 and sensing for a rise in voltage at implant regions 111 and 112. A programmed state for programming region 101a or 101b effectively resistively couples the corresponding NFET structure's gate (e.g., electrode 140) to its drain region (formed in doped substrate 110 when a corresponding programming region breaks down), and can result in a voltage rise at the corresponding source (e.g., implant region 111 or 112), thereby allowing for sensing of a programmed state.

Thus, an embodiment of the present inventive concepts can form an OTP device pair in an area of semiconductor die smaller than is typically used to form a single conventional OTP device, and it can do so by exhibiting relatively small programming regions, which can result in higher device density and reliability statistics than with conventional art, thereby significantly reducing the cost to implement a variety of OTP functions in integrated circuits (ICs).

Figure 2:
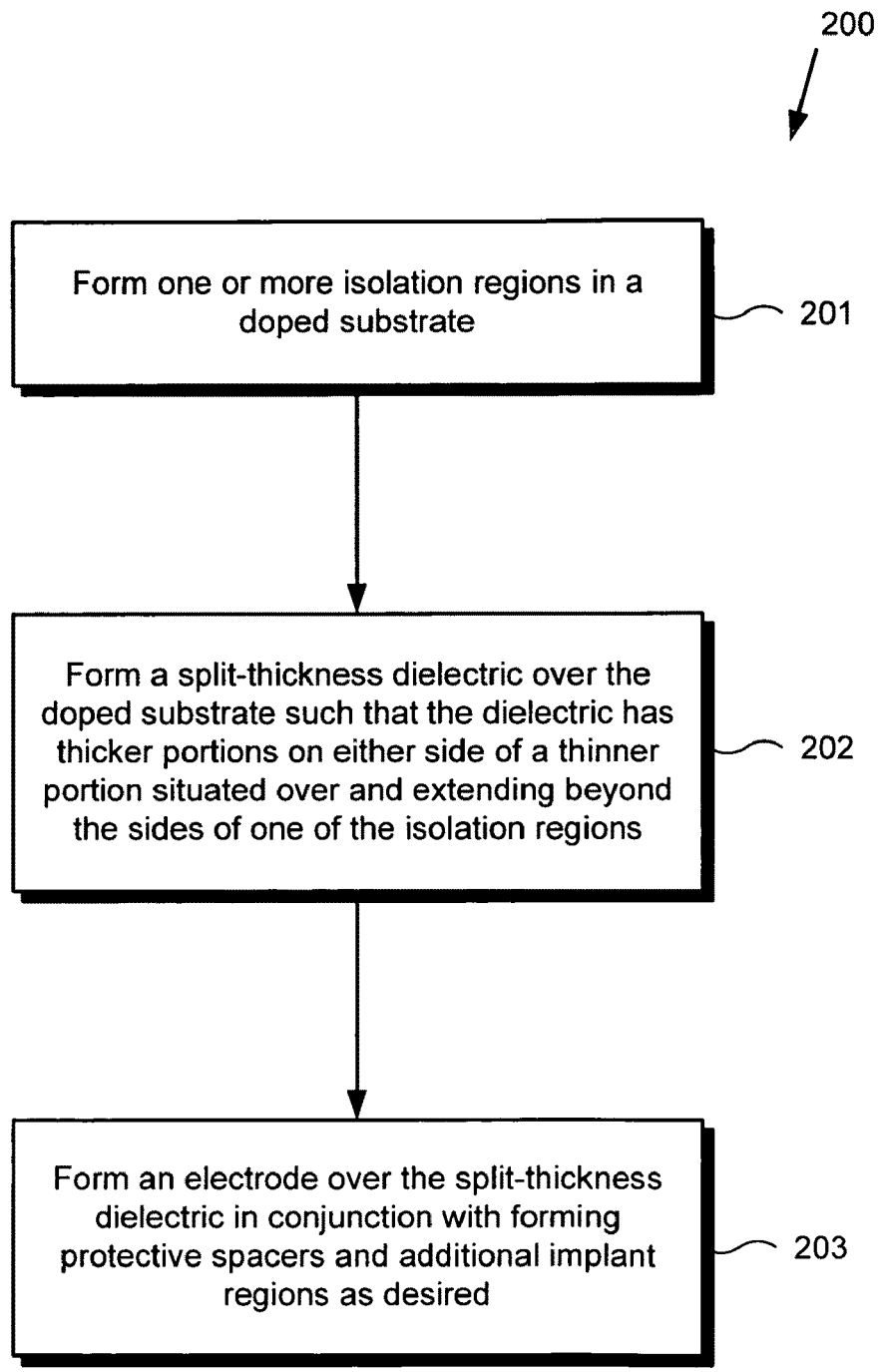
FIG. 2 shows a flowchart illustrating steps taken to implement a method of fabricating an integrated OTP semiconductor device pair, according to an embodiment of the present invention.

FIG. 2 shows a flow chart illustrating a method for fabricating an OTP semiconductor device according to an embodiment of the present invention. Certain details and features have been left out of flowchart 200 that are apparent to a person of ordinary skill in the art. For example, a step may consist of one or more substeps or may involve specialized equipment or materials, as known in the art. Steps 201 through 203 indicated in flowchart 200 are sufficient to describe one embodiment of the present invention; however, other embodiments of the invention may make use of steps different from those shown in flowchart 200. Moreover, FIGS. 3A, 3B and 1 illustrate the result of performing steps 201 through 203 of flowchart 200, respectively. For example, FIG. 3A shows a semiconductor structure after processing step 201, FIG. 3B shows the structure in FIG. 3A after processing step 202, and FIG. 1 shows the structure in FIG. 3B after processing step 203.

It is noted that the processing steps shown in flowchart 200 are performed on a portion of a processed wafer, which, prior to step 201, may include a semiconductor substrate, such as a doped silicon substrate, formed using conventional techniques. The wafer is also referred to simply as a wafer or a semiconductor die or simply a die in the present application. It is also noted that doped substrate 310, isolation regions 320, 321 and 322, and split-thickness dielectric 330 in FIGS. 3A and 3B correspond respectively to substrate 110, isolation regions 120, 121 and 122, and split-thickness dielectric 130 as discussed with respect to FIG. 1 above, e.g., each corresponding feature can comprise the same material as its counterpart, and each can be formed utilizing the same methods used to form its counterpart.

Referring now to step 201 of the method embodied in FIG. 2, step 201 of flowchart 200 comprises forming one or more isolation regions in a doped semiconductor substrate. FIG. 3A shows a structure including doped substrate 310 after completion of step 201 of flowchart 200 in FIG. 2, where isolation regions 320, 321 and 322 have been formed, for example, in doped substrate 310.

As depicted in FIG. 3A, doped substrate 310 can comprise, for example, silicon lightly doped with a P type dopant, and can be formed, for example, by a high-energy implant and annealing procedure as known in the art. Doped substrate 310 can be configured to support formation of isolation regions 320, 321 and 322, or other semiconductor structures, or multiple embodiments of any of the above. Doped substrate 310 can also be configured, for example, as an element of NFET structures 102a and 102b of FIG. 1 (e.g., as a channel for NFET structures 102a and 102b). Isolation regions 320, 321 and 322 can be shallow trench isolation (STI) regions comprised of silicon oxide or other dielectric material, for example, and can be configured to electrically isolate semiconductor structures formed to either side of each isolation region from each other or to isolate semiconductor structures from doped substrate 310.

Continuing with step 202 in FIG. 2 and referring to FIG. 3B, step 202 of flowchart 200 comprises forming a split-thickness dielectric over isolation region 321 and a portion of doped substrate 310. FIG. 3B shows the structure in FIG. 3A after completion of step 202 of flowchart 200, where split-thickness dielectric 330 can be formed over isolation region 321 and portions of doped substrate 310, such that a thinner center portion of split-thickness dielectric 330 (or the "reduced-thickness center portion" of the split-thickness dielectric), situated between thicker outer portions of split-thickness dielectric 330, can extend beyond the sides of isolation region 321 to help form programming regions 101a and 101b of FIG. 1.

Split-thickness dielectric 330 can be a segment of gate dielectric (e.g., a dielectric suitable for forming an NFET gate dielectric) comprising, for example, an oxide, such as silicon dioxide ($SiO_2$) or the like, and can be formed by, for example, employing deposition or growth processes in conjunction with conventional mask and etch processes as known in the art. Split-thickness dielectric 330 can be configured, for example, to serve both as an element of NFET structures 102a and 102b of FIG. 1 (e.g., as a gate dielectric for NFET structures 102a and 102b) and as a programmable dielectric exhibiting reliable breakdown characteristics for programming regions 101a and 101b of FIG. 1.

Moving now to step 203 of FIG. 2 and referring to FIG. 1, step 203 of flowchart 200 comprises forming an electrode over split-thickness dielectric 330 of FIG. 3B, forming protective spacers around the electrode and dielectric, and forming additional implant regions to facilitate fabrication of coupled semiconductor structures, such as NFET structures 102a and 102b of FIG. 1. FIG. 1 shows the structure in FIG. 3B after completion of step 203 of flowchart 200, where electrode 140 can be formed over split-thickness dielectric 130, spacers 150 can be formed around electrode 140 and split-thickness dielectric 130, and where implant regions 111 and 112 and lightly doped extension regions 113 and 114 can be formed in doped substrate 110 to facilitate fabrication of NFET structures 102a and 102b.

Electrode 140 can comprise, for example, a segment of N type doped polysilicon, or some other material suitable for forming, for example, a gate electrode for an NFET, and can be formed over a layer of dielectric (e.g., split-thickness dielectric 130) by, for example, employing a low pressure chemical vapor deposition (LPCVD) process or other suitable deposition process coupled with a doping process and a mask and etch process as known in the art. Electrode 140 can be configured, for example, to serve concurrently as a gate electrode for a pair of NFETs (e.g., for NFET structures 102a and 102b) and as an electrode for a corresponding pair of programming regions (e.g., for programming regions 101a and 101b).

Spacers 150 can comprise silicon oxide or other dielectric material as known in the art, and can be formed, for example, by employing a CVD process or other deposition process to conformally deposit a layer of such dielectric material over electrode 140 and split-thickness dielectric 130 and then appropriately etching the layer of dielectric material in an etch-back process as known in the art. As shown in FIG. 1, spacers 150 can be configured to protect and isolate one or more OTP devices such as OTP device 100.

Implant regions 111 and 112 can be, for example, heavily doped N type implant regions of doped substrate 110 (e.g., an implant region suitable for forming a source for an NFET) and can be formed, for example, by a high-energy implant and annealing procedure as known in the art. Implant regions 111 and 112 can be configured to serve, for example, as elements of NFET structures 102a and 102b respectively (e.g., as sources for NFET structures 102a and 102b).

Also shown in FIG. 1 are lightly doped extension regions 113 and 114 formed under spacers 150 and partially under split-thickness dielectric 130. Lightly doped extension regions 113 and 114 can be, for example, lightly doped N type implant region extensions of implant regions 111 and 112 respectively (e.g., implant region extensions suitable for forming lightly doped source extensions for an NFET) and can be formed, for example, by a high-energy implant and annealing procedure as known in the art. Implant regions 113 and 114 can be configured to serve, for example, as elements of NFET structures 102a and 102b (e.g., as lightly doped source extensions for NFET structures 102a and 102b).

It is noted that although the embodiment in FIG. 1 can comprise a pair of programming regions 101a and 101b coupled with a pair of NFET structures 102a and 102b, respectively, other embodiments of the present invention can comprise many multiple embodiments of each, where each design is limited only by available wafer size and available fabrication techniques.

After completion of step 203 of flowchart 200 in FIG. 2, patterned silicide layers, additional protective dielectric layers and metal contacts (not shown in FIG. 1) can be formed over OTP device 100 using multiple conventional layering, mask and etch processes as known in the art, where each can be configured to facilitate later integration of OTP device 100 into analog and mixed signal semiconductor circuits such as ICs containing, for example, multiple NFETs, PFETs, integrated resistors, integrated capacitors and other integrated OTP semiconductor device pairs formed according to the present inventive concepts.

Figure 4:
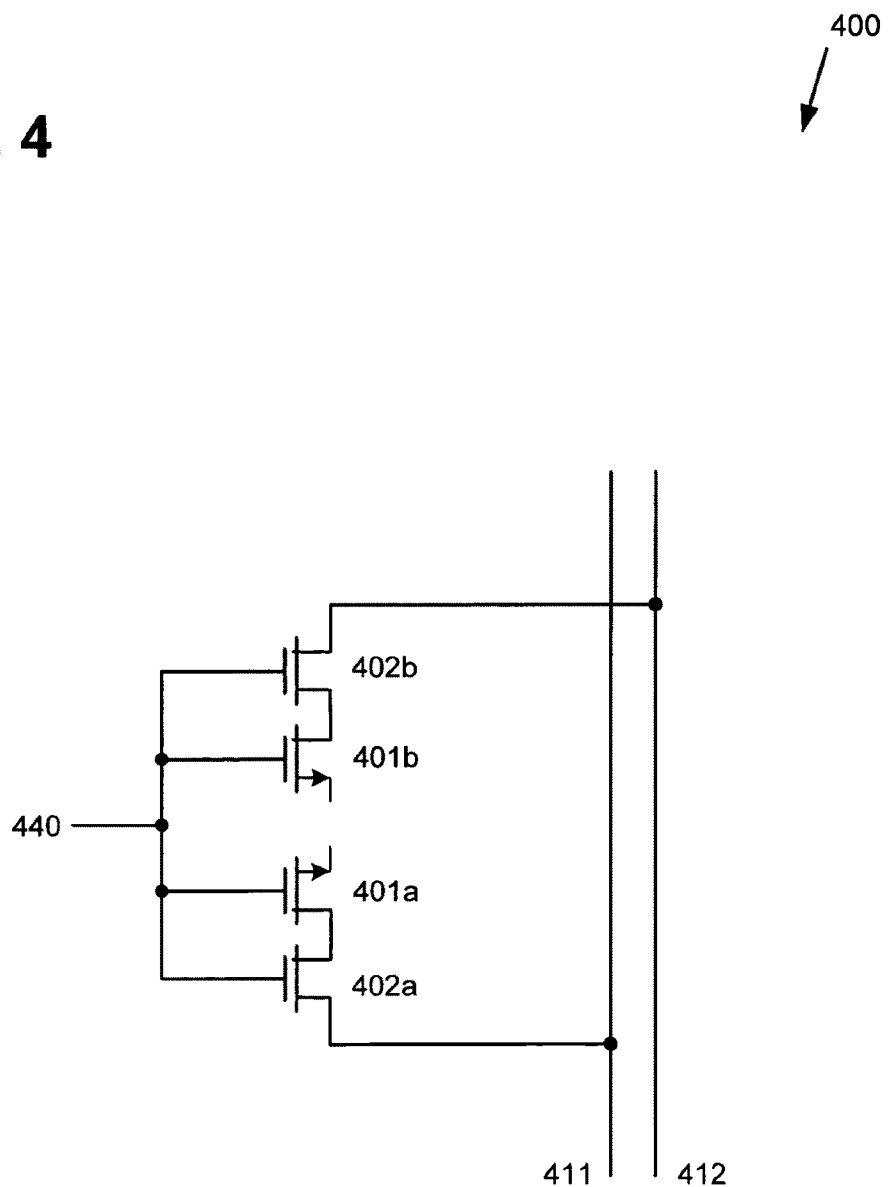
FIG. 4 illustrates an equivalent circuit schematic of a portion of a wafer processed according to an embodiment of the invention, corresponding to an embodiment as shown in FIG. 1.

For example, schematic 400 of FIG. 4 represents an equivalent circuit schematic for OTP device 100 of FIG. 1, such that electrode 140, implant regions 111 and 112, programming regions 101a and 101b and NFET structures 102a and 102b of FIG. 1 correspond, respectively, to wordline 440 (or gate electrodes 440), bitlines 411 and 412, programmable fuses 401a and 401b and NFET transistors 402a and 402b. One skilled in the art can extrapolate from schematic 400 to combine multiple embodiments of OTP device 100 into, for example, an array where each row of devices can share a commonly connected wordline and each column of devices can share commonly connected bitlines for each of their respective OTP cells. Individual cells across the array can then be programmed or sensed by using, for example, the programming and sensing techniques described with respect to FIG. 1, above. It is noted that the circuit of FIG. 4 can be implemented as part of an IC utilizing, for example, a CMOS process, where the IC would include many other CMOS devices in a manner known in the art. This design strategy, coupled with an embodiment of the present inventive concepts, can minimize the number of connections required to operate such an array, thereby minimizing the size, complexity and cost of such an IC as a whole.

While the embodiment shown in FIGS. 3A, 3B and 1 may be characterized as an OTP device comprising a pair of programming regions fabricated in conjunction with a pair of NFET structures, such that electrode 140, split-thickness dielectric 130 and doped substrate 110 can be concurrent constituents of all four structures, in another embodiment the process for forming OTP device 100 can be suitably modified to correspond to a PFET structure fabrication process (not explicitly shown by the present figures), such that electrode 140, split-thickness dielectric 130 and doped substrate 110 of OTP device 100 can be concurrent constituents of a pair of programming regions coupled with a pair of PFET structures (also not explicitly shown by the present figures).

Thus, by leveraging materials and processes available as part of multiple typical transistor fabrication processes to form an OTP device pair within a relatively small area of a semiconductor die, the process for forming an embodiment of the disclosed integrated OTP semiconductor device pair can provide OTP devices that can be fabricated in volume at a significantly lower cost compared to a conventional OTP device, as is described above. Additionally, because the present inventive concepts disclose OTP devices that can exhibit smaller programming regions than is typically found in conventional art, embodiments of the present invention can exhibit relatively reliable programmed impedences, which can reduce a need for higher sensing voltages and/or redundancy structures, thereby reducing the size, complexity, and cost of fabrication.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A one-time programmable (OTP) semiconductor device pair comprising:
    an isolation region formed in a doped semiconductor substrate;
    a split-thickness dielectric formed over said isolation region;
    an electrode formed over said split-thickness dielectric;
    said split-thickness dielectric having a reduced-thickness center portion;
    said reduced-thickness center portion extending beyond said isolation region to form first and second programming regions of said OTP semiconductor device pair.

2. The OTP semiconductor device pair of claim 1, wherein said isolation region is a shallow trench isolation (STI) region.

3. The OTP semiconductor device pair of claim 1, further comprising two transistor structures formed substantially concurrently with said OTP semiconductor device pair, wherein two outer portions of said split-thickness dielectric and said electrode comprise respective gates of said two transistor structures.

4. The OTP semiconductor device pair of claim 3, further comprising first and second implant regions formed in said doped semiconductor substrate adjacent to said two outer portions of said split-thickness dielectric, wherein said first and second implant regions comprise first and second source regions, respectively, for said two transistor structures.

5. The OTP semiconductor device pair of claim 4, further comprising third and fourth implant regions formed in said doped semiconductor substrate, said third and fourth implant regions comprising source extension regions of said first and second source regions, respectively, for said two transistor structures.

6. The OTP semiconductor device pair of claim 1, further comprising protective spacers formed around said split-thickness dielectric.

7. The OTP semiconductor device pair of claim 4, further comprising at least one metal contact formed over at least one of said electrode and said first and second source regions.

8. A method of fabricating a one-time programmable (OTP) semiconductor device pair, said method comprising:
    forming an isolation region in a doped semiconductor substrate;
    forming a split-thickness dielectric over said isolation region, said split-thickness dielectric having a reduced-thickness center portion;
    forming an electrode over said split-thickness dielectric;
    said reduced-thickness center portion extending beyond said isolation region to form first and second programming regions of said OTP semiconductor device pair.

9. The method of claim 8, wherein said isolation region is a shallow trench isolation (STI) region.

10. The method of claim 8, further comprising forming two transistor structures substantially concurrently with said OTP semiconductor device pair, wherein two outer portions of said split-thickness dielectric and said electrode comprise respective gates of said two transistor structures.

11. The method of claim 10, further comprising forming first and second implant regions in said doped semiconductor substrate adjacent to said two outer portions of said split-thickness dielectric, wherein said first and second implant regions comprise first and second source regions, respectively, for said two transistor structures.

12. The method of claim 11, further comprising forming third and fourth implant regions in said doped semiconductor substrate, said third and fourth implant regions comprising source extension regions of said first and second source regions, respectively, for said two transistor structures.

13. The method of claim 11, further comprising forming at least one metal contact over at least one of said electrode and said first and second source regions.

14. An integrated circuit (IC) including at least one CMOS device and at least one one-time programmable (OTP) semiconductor device pair, said at least one OTP semiconductor device pair comprising:
    an isolation region formed in a doped semiconductor substrate;
    a split-thickness dielectric formed over said isolation region;
    an electrode formed over said split-thickness dielectric;
    said split-thickness dielectric having a reduced-thickness center portion;
    said reduced-thickness center portion extending beyond said isolation region to form first and second programming regions for said at least one OTP semiconductor device pair.

15. The IC of claim 14, wherein said isolation region is a shallow trench isolation (STI) region.

16. The IC of claim 14, further comprising two transistor structures formed substantially concurrently with said at least one OTP semiconductor device pair, wherein two outer portions of said split-thickness dielectric and said electrode comprise respective gates of said two transistor structures.

17. The IC of claim 16, further comprising first and second implant regions formed in said doped semiconductor substrate adjacent to said two outer portions of said split-thickness dielectric, wherein said first and second implant regions comprise first and second source regions, respectively, for said two transistor structures.

18. The IC of claim 17, further comprising third and fourth implant regions formed in said doped semiconductor substrate, said third and fourth implant regions comprising source extension regions of said first and second source regions, respectively, for said two transistor structures.

19. The IC of claim 17, further comprising at least one metal contact formed over at least one of said electrode and said first and second source regions.

20. The IC of claim 19, wherein a plurality of OTP semiconductor device pairs are formed in an array structure comprising:
- at least one row of said plurality of OTP semiconductor device pairs wherein each electrode of each OTP semiconductor device pair in each row is commonly connected;
- at least one column of said plurality of OTP semiconductor device pairs wherein each first source region of each OTP semiconductor device pair in each column is commonly connected and each second source region of each OTP semiconductor device pair in each column is commonly connected.

* * * * *